(12) United States Patent
Wong

(10) Patent No.: US 7,234,513 B2
(45) Date of Patent: Jun. 26, 2007

(54) MICROCHANNEL FLAT-PLATE HEAT PIPE WITH PARALLEL GROOVES FOR RECYCLING COOLANT

(75) Inventor: Shwin-Chung Wong, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 383 days.

(21) Appl. No.: 10/826,347

(22) Filed: Apr. 19, 2004

(65) Prior Publication Data
US 2005/0183847 A1    Aug. 25, 2005

Related U.S. Application Data

(63) Continuation-in-part of application No. 10/785,174, filed on Feb. 24, 2004, now Pat. No. 7,011,146.

(51) Int. Cl.
*F28D 15/04* (2006.01)
(52) U.S. Cl. .............................. 165/104.33; 165/104.26
(58) Field of Classification Search ........... 165/104.33, 165/104.26, 104.21, 185

See application file for complete search history.

(56) References Cited

U.S. PATENT DOCUMENTS

| | | | | |
|---|---|---|---|---|
| 6,019,165 | A * | 2/2000 | Batchelder | 165/80.3 |
| 6,681,843 | B2 * | 1/2004 | Sugito | 165/104.33 |
| 6,725,910 | B2 * | 4/2004 | Ishida et al. | 165/104.26 |
| 2003/0106671 | A1* | 6/2003 | Cho et al. | 165/104.26 |
| 2003/0136551 | A1* | 7/2003 | Bakke | 165/104.26 |

* cited by examiner

*Primary Examiner*—Teresa J. Walberg
(74) *Attorney, Agent, or Firm*—H.C. Lin, Patent Agent

(57) ABSTRACT

Heat from a heat generating device such as a CPU is dissipated by a heat sink device containing a recycled two-phase vaporizable coolant. The coolant recycles inside a closed metal chamber, which has an upper section and a lower section connected by a conveying conduit, and a wick evaporator placed in the lower section. The liquid coolant in the evaporator is vaporized by the heat from the heat generating device. The coolant vapor enters the upper section and condenses therein, with the liberated latent heat dissipated out through the inner top chamber wall. The condensed coolant is then collected and flows into the lower section, and further flows back to the wick evaporator by capillary action of the evaporator, thereby recycling the coolant. Space or a piece of element with parallel grooves is used to form at least one of the sections to reduce friction in the liquid flow path.

9 Claims, 28 Drawing Sheets

207C

MICROCHANNEL FLAT-PLATE HEAT PIPE WITH PARALLEL GROOVES FOR RECYCLING COOLANT

This is a continuation-in-part application of application Ser. No. 10/785,174 filed Feb. 24, 2004 now U.S. Pat. No. 7,011,146.

BACKGROUND OF THE INVENTION (1) Field of the Invention

This invention relates to a heat pipe, in particular, a microchannel flat-plate heat pipe used for heat dissipation for a central processing unit (CPU) or other electronic integrated circuit (IC) chips.

(2) Brief Description of Related Art

The latest generation of Pentium IV CPU generates power more than 100 watts (Joule/sec). In order to maintain its normal performance and avoid overheating of the unit, more effective heat dissipating mechanism is needed. U.S. Pat. No. 5,880,524 discloses a heat pipe for spreading the heat generated by a semiconductor device as shown in FIG. 1. A cavity 105 is enclosed by a base metal 100 for a working liquid (not shown in the figure) to recycle. Heat sink fins 101 are arranged on the top of the base metal 100 for heat dissipation. Heat transfer medium 102 is under the base metal 100 to contact with a CPU.

A two-phase vaporizable liquid resides within the cavity 105 and serves as the working fluid (the coolant) for the heat pipe. A metal wick 103 is disposed on the inner walls to form a recycling loop within cavity 105 to facilitate the flow of the working fluid within the cavity. The working liquid in the cavity 105 flows in a direction as shown in arrows in FIG. 1. Firstly the working liquid is absorbed in the bottom portion of the wick 103. It evaporates when heat is transferred from the CPU and then condenses on the top portion of the wick 103. Heat is further transferred upward to the heat sink fins 101. The condensed liquid absorbed in the top portion of the wick 103 is then moved to the lower portion of the wick 103 due to capillary action of the wick 103.

SUMMARY OF THE INVENTION

An objective of this invention is to devise a coolant recycle mechanism with space passages as part of the recycling passage to decrease the friction for the coolant flow in a heat pipe. Another objective of this invention is to devise a coolant recycle mechanism with parallel grooves as a part of the passage to decrease the friction for the flow of the working fluid. A further objective of this invention is to devise a more effective heat dissipation mechanism for a heat pipe. By using space passages, parallel grooves or a combination of both as part of the passage, the friction for the liquid flow is reduced and the capillary action effectively enhances the recycling of the coolant.

DETAILED DESCRIPTION OF THE INVENTION

Figure 1:
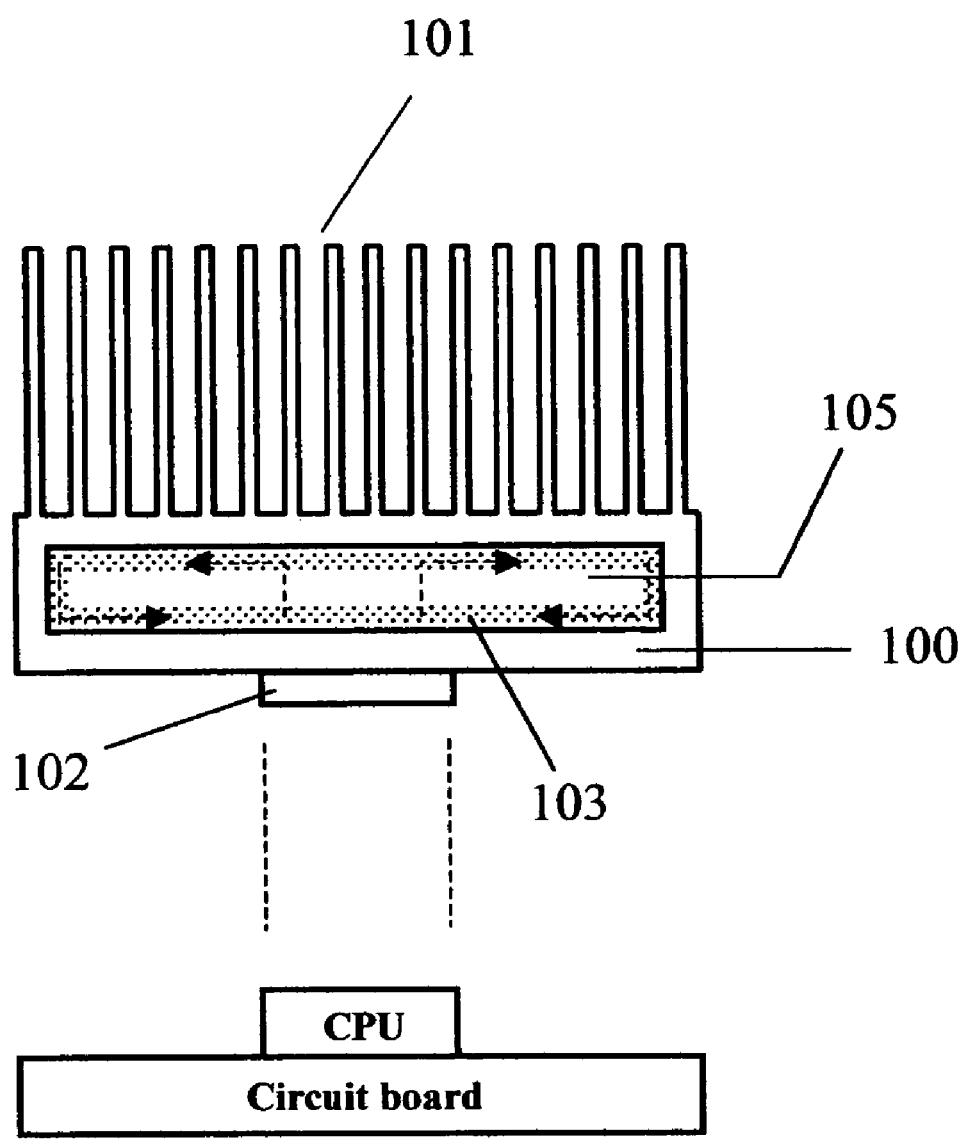
FIG. 1 Prior art.
Figure 2:
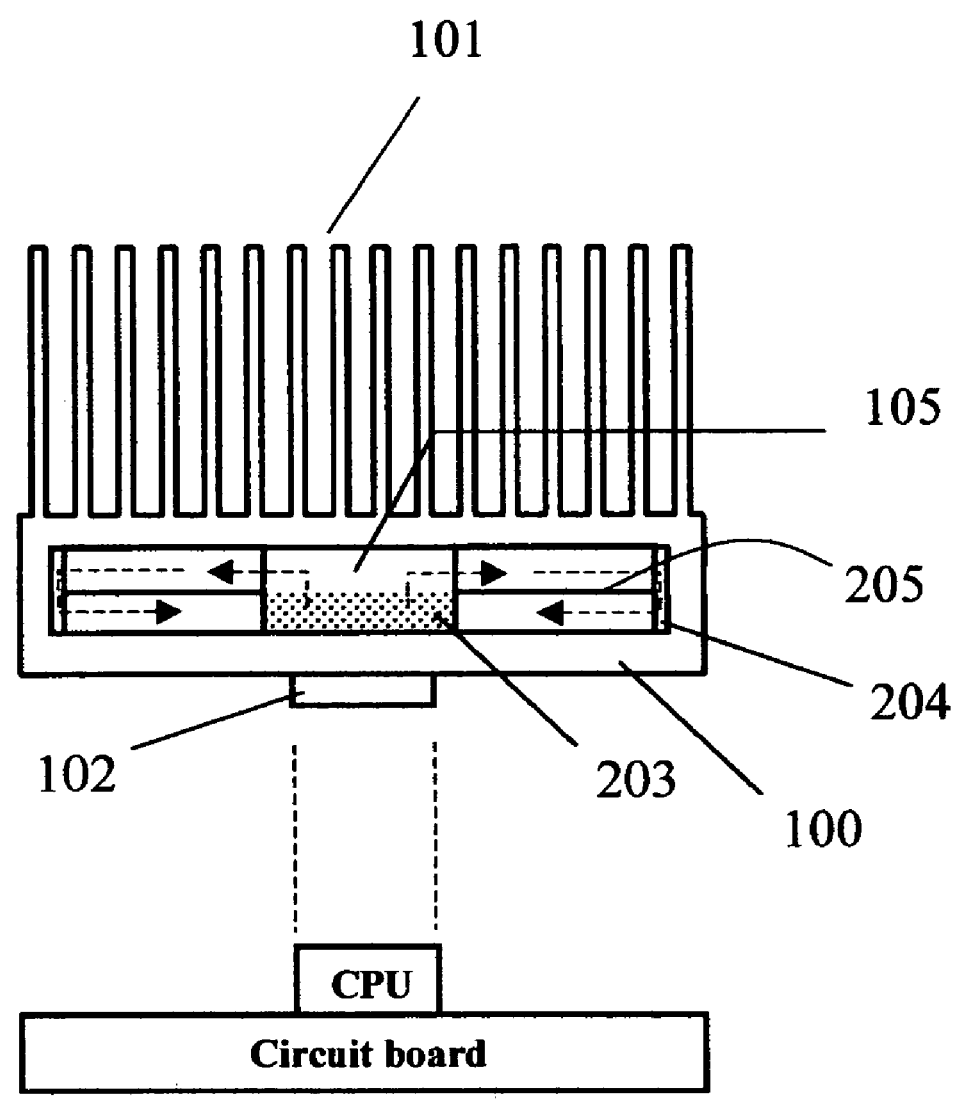
FIG. 2 First embodiment of this invention.

The principle of this invention is to use space passages, parallel grooves or a combination of both as part of the passage for the flow of the working liquid within a flat-plate heat pipe. FIG. 2 shows the first embodiment of this invention. Cavity 105 is enclosed by a base metal 100. Multiple sections are divided in the cavity 105 for the recycling of the working liquid. The working liquid moves in a direction following the arrows shown in the figure.

Figure 3:
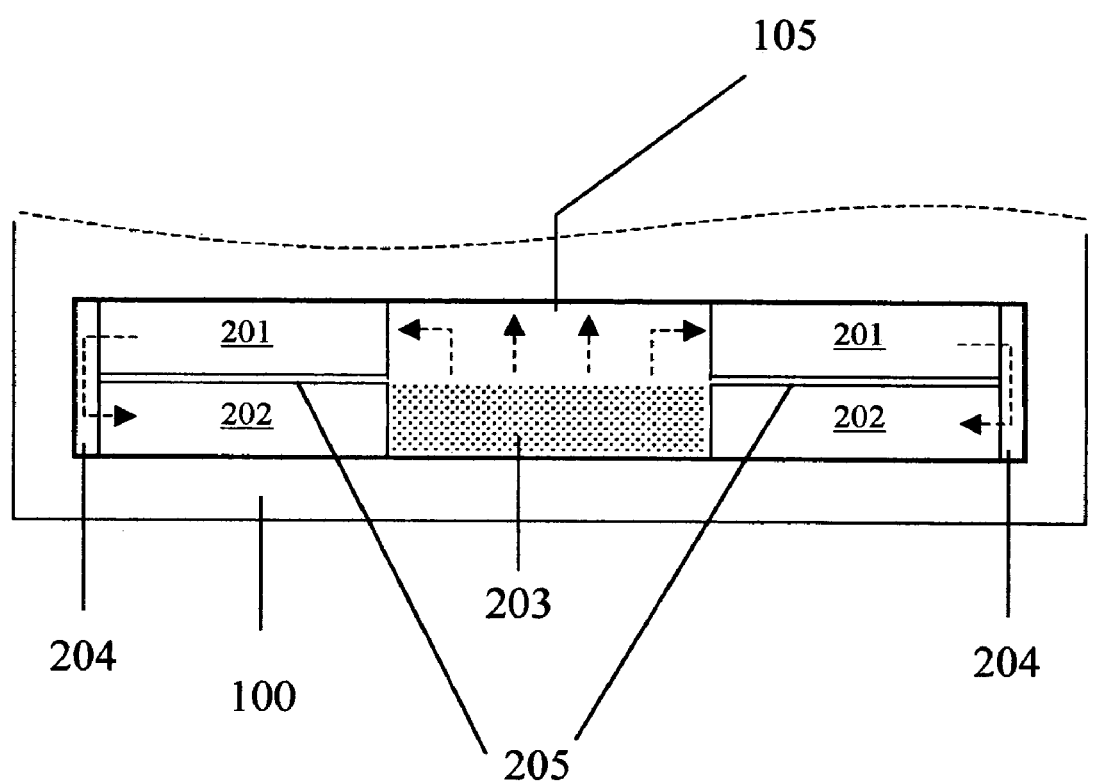
FIG. 3 Enlarged plane view of the recycle mechanism of FIG. 2.

FIG. 3 shows an enlarged plane view of the recycle mechanism in the cavity 105 of FIG. 2. There are four sets of parallel grooves shown in this design. A first set of left parallel grooves 201 and a second set of left parallel grooves 202 are arranged on the left of the wick 203. A third set of right parallel grooves 201 and a fourth set of right parallel grooves 202 are arranged on the right side of the wick 203. The two sets of grooves 201 and 202 are separated with an isolation plate 205. The recycling principle for the left two sets of grooves 201 and 202 is exactly the same as that for the right-side two sets of grooves 201 and 202, and therefore only two left-side grooves are described below.

Working liquid (not shown) is absorbed in the wick 203. The wick 203 can be made of sintered copper (Cu) powder, sintered nickel (Ni) powder, or sintered stainless-steel powder. Alternatively, the wick 203 can be made of single-layer or multi-layer of metal wire mesh (not shown) or metal wire cloth (not shown). When the heat pipe is attached to a heat generating unit such as a central process unit (CPU), a certain amount of the working liquid in the wick 203 is heated and vaporized as shown by the arrows. Part of the vapor condenses on the inner top surface within the cavity 105, which is enclosed by the base metal 100. Part of the vapor enters a first set of parallel grooves 201 to condense. The condensed liquid is collected in the corners of the parallel grooves. The liquid is then driven by the vapor flow and the capillary action to a second set of parallel grooves 202 under the first set of parallel grooves 201 through a slot 204. The conveying slot 204 is located at a common end of the two sets of grooves to connect the two sets of grooves 201 and 202. The wick 203 is located on the other end of the grooves 202 and has a height no less than the height of the grooves 202. The evaporation of the liquid in the wick 203 leads to a liquid-vapor interface within the wick 203. This liquid-vapor interface results in a capillary pulling force on the working liquid in grooves 202 toward the wick 203 to make a full cycle: liquid→vapor→cooling→liquid, following the arrows as shown in FIG. 3.

Figure 4:
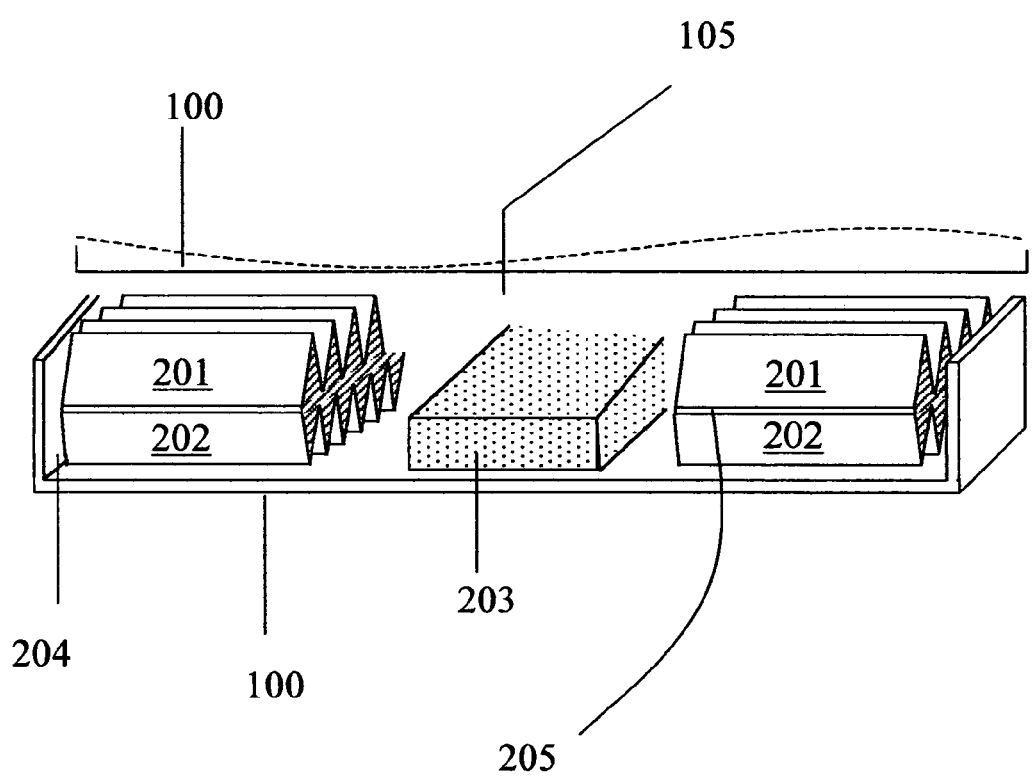
FIG. 4 Explosive perspective view of the recycle mechanism of FIG. 2.

FIG. 4 shows the explosive perspective view of the recycle mechanism of FIG. 2. The parallel grooves 201 and 202 can be made separately before being connected together. Alternatively, the parallel grooves 201 and 202 can also be made integrally as a single body by molding or extrusion, or by etching, cutting, or machining on a metal plate. The cross-sectional shape of the grooves is triangular as illustrated, or of other shapes, such as rectangular or trapezoidal, etc. The base material for grooves 201 and 202 can be metal or nonmetal such as silicon or plastics, etc. may also be used.

In this embodiment, the grooves 201 and 202 are essentially independent of each other except being communicated by the slot 204 so that the liquid flowing in grooves 202 is not dragged by the vapor flow in grooves 201 in the opposite direction.

In order for effective condensation of the vapor molecules in the first set of parallel grooves 201, single-sided grooves in contact with the inner top surface of the cavity is desired for the first set of parallel grooves 201. However, for the second set of parallel grooves 202 where condensed liquid flows, either a set of single-sided grooves or a set of double-sided grooves works equally well. Double-sided grooves can be made using a corrugated sheet (not shown). Single-sided grooves 202 are shown in FIG. 4. They can be made by the way of molding, extrusion, or by etching, cutting, or machining on a metal plate.

Figure 5:
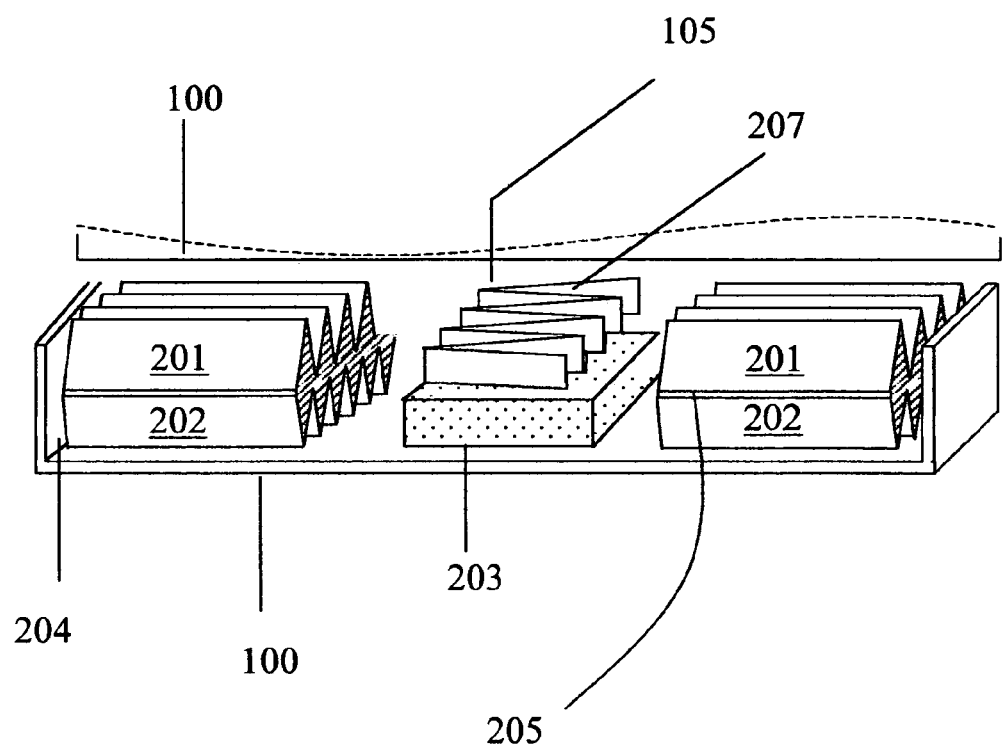
FIG. 5 Second embodiment of this invention.

FIG. 5 shows a second embodiment of this invention. This embodiment includes a vertical guiding plate 207 above the wick 203 to bridge the wick 203 and the inner top surface of the base metal 100. The guiding plate 207 allows part of the condensed liquid on the inner top surface to flow downward back to the wick 203 directly. The guiding plate 207 also serves as a strengthener against the inward pressure when the cavity 105 is evacuated.

Figure 6:
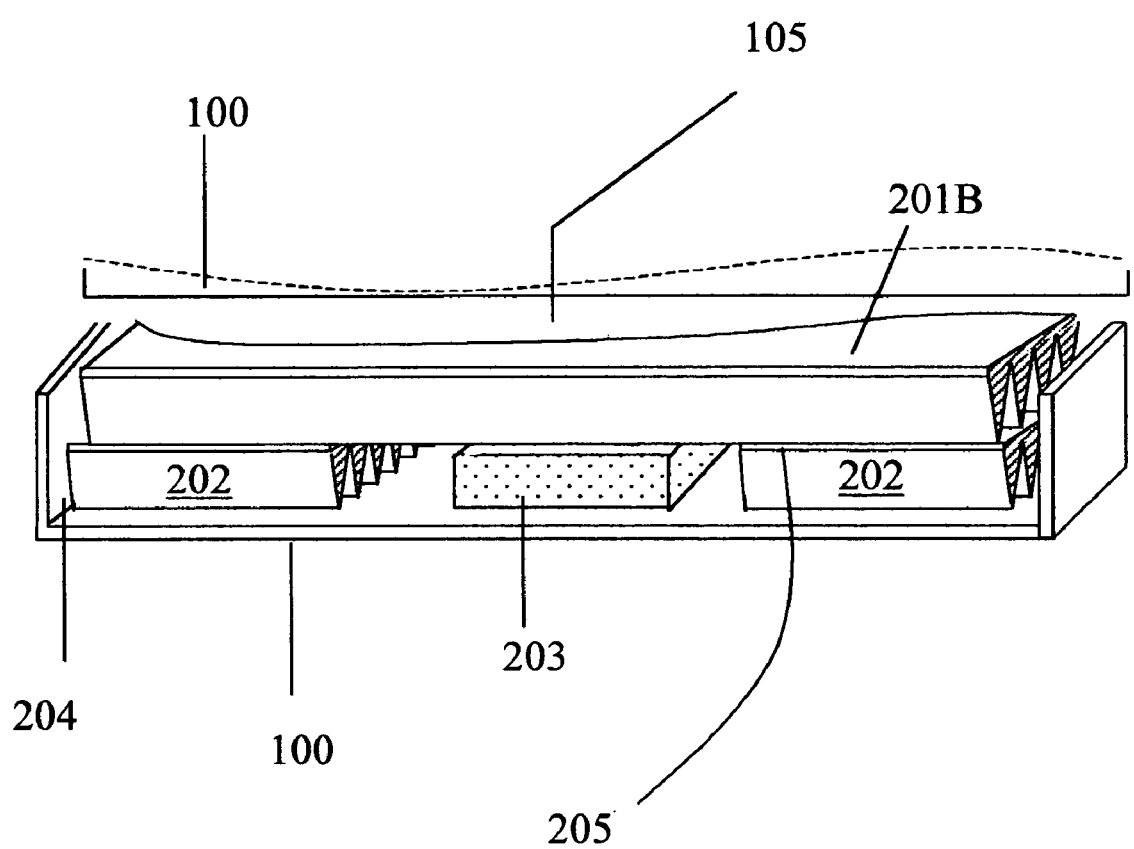
FIG. 6 Third embodiment of this invention.

FIG. 6 shows a third embodiment of this invention. This embodiment uses an elongated grooves 201B over the top of the wick 203.

Figure 7:
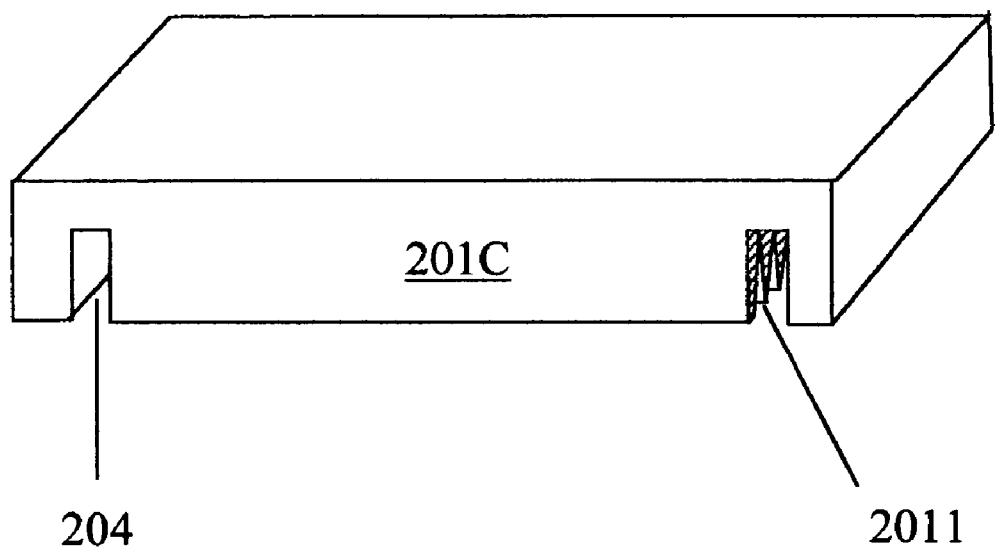
FIG. 7 Fourth embodiment of this invention.

FIG. 7 shows a fourth embodiment of this invention. Shown herein is a half-cut piece, with the front surface representing the mid-plane cross-section of the whole unit. This embodiment shows that the first set of parallel grooves and the conveying slot 204 can be integrated with the top part of the base metal 100 to form a top metal base 201C. The parallel grooves 2011 and the conveying slot 204 can be fabricated by molding, or by cutting, scribing, or etching the base metal 100.

Figure 8:
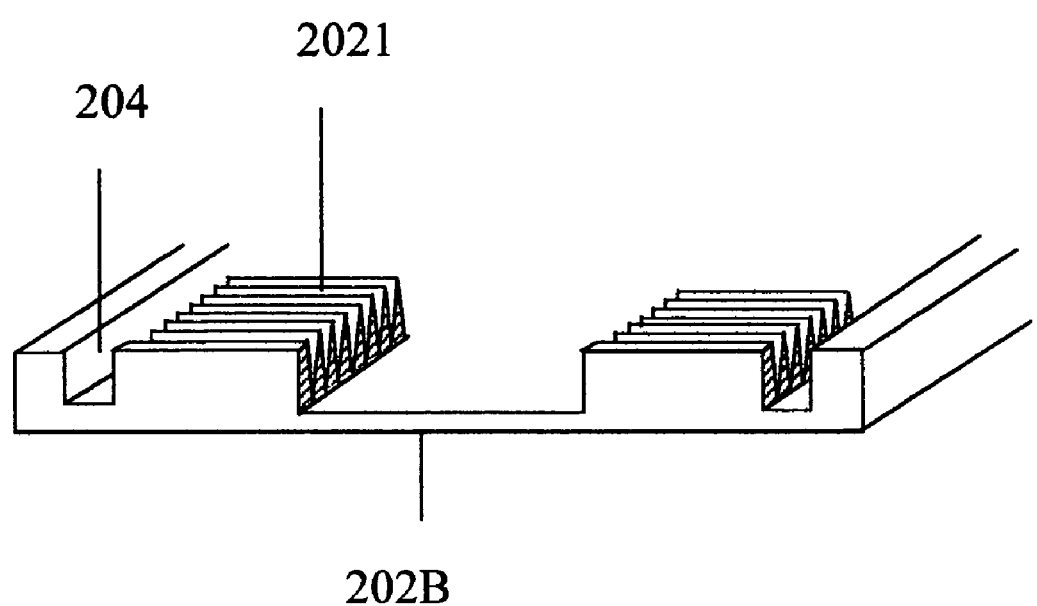
FIG. 8 Fifth embodiment of this invention.

FIG. 8 shows a fifth embodiment of this invention. Shown herein is also a half-cut piece, with the front surface representing the mid-plane cross-section of the whole unit. Similar to the fourth embodiment of FIG. 7, the second set of parallel grooves 202 and the conveying slot 204 can be integrated with the bottom part of the base metal 100 to form the bottom metal base 202B. Parallel grooves 2021 and the conveying slot 204 can be fabricated by molding, or by cutting, scribing, or etching the base metal 100.

Figure 9:
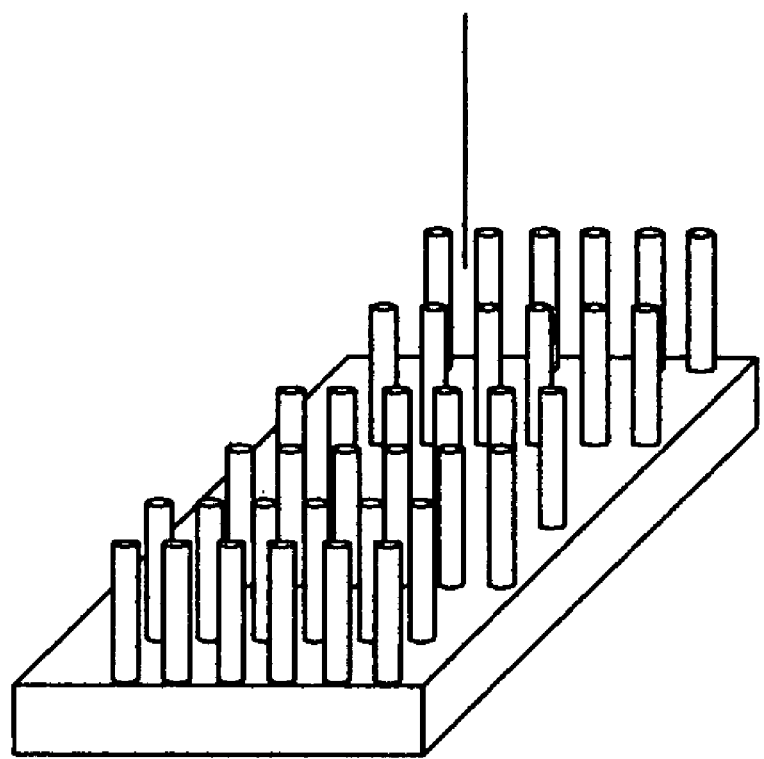
FIG. 9 Sixth embodiment of this invention.

FIG. 9 shows a sixth embodiment of this invention. This embodiment shows that the wick 203 in the previous embodiments can be replaced with a pin-array block 203B. The space between the pins is used to absorb the working liquid by capillary attraction. The vertically open space allows for easy escape of bubbles once they are formed under high heat power conditions. This design is aimed at extending the dry-out limits of the working liquid in the wick 203.

Figure 10:
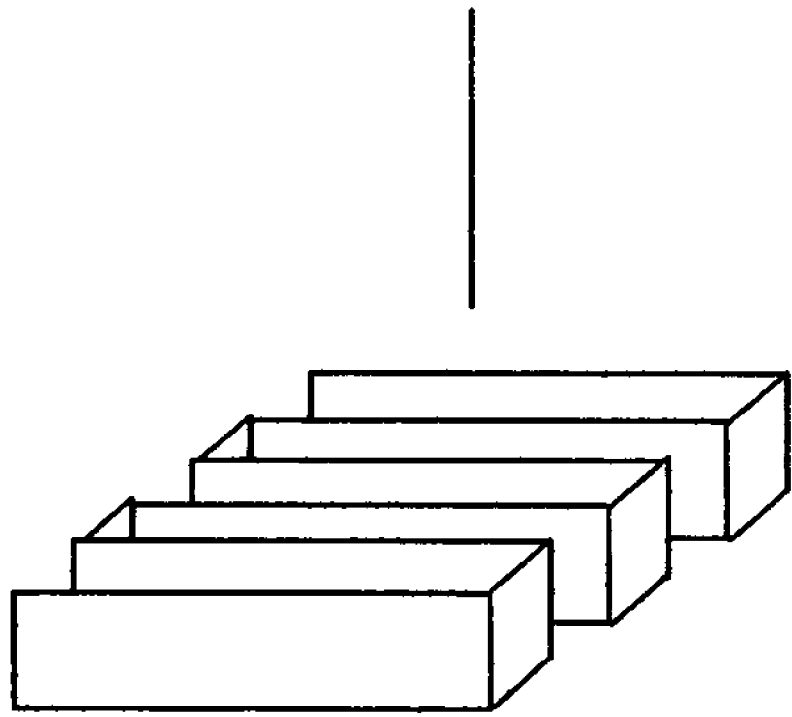
FIG. 10 Seventh embodiment of this invention.

FIG. 10 shows a seventh embodiment of this invention. This embodiment uses a different shape of corrugated metal 207B. The square corrugated metal 207B used herein differs from the V-shaped corrugated metal 207 in FIG. 5. Other forms of corrugation are also usable, such as spiral corrugation, S-shaped corrugation, etc., and are not exhaustive in this specification.

Figure 11:
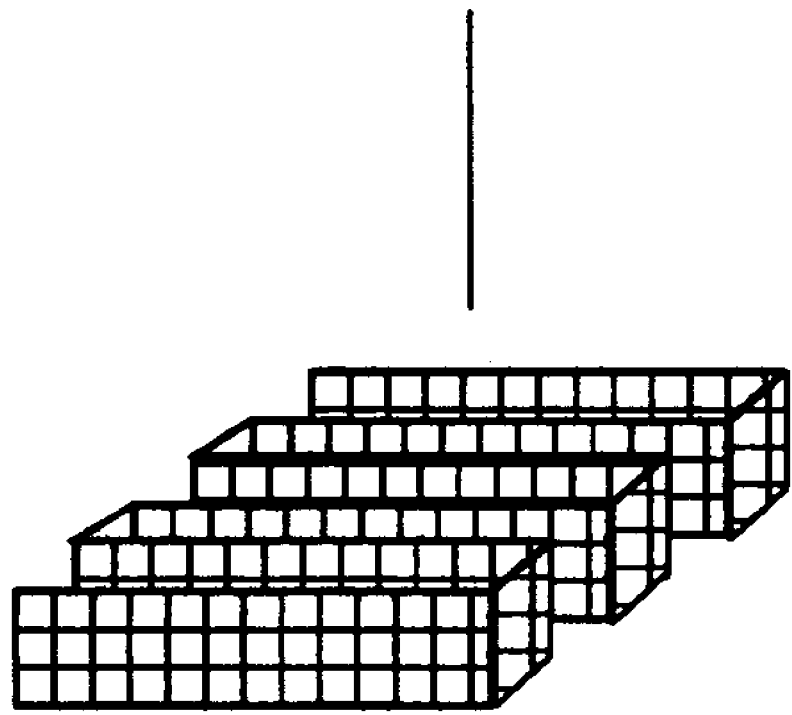
FIG. 11 Eighth embodiment of this invention.

FIG. 11 shows an eighth embodiment of this invention. This embodiment uses a meshed metal 207C as the guiding plate, rather than the non-meshed guiding plate 207B in FIG. 10.

Figure 12:
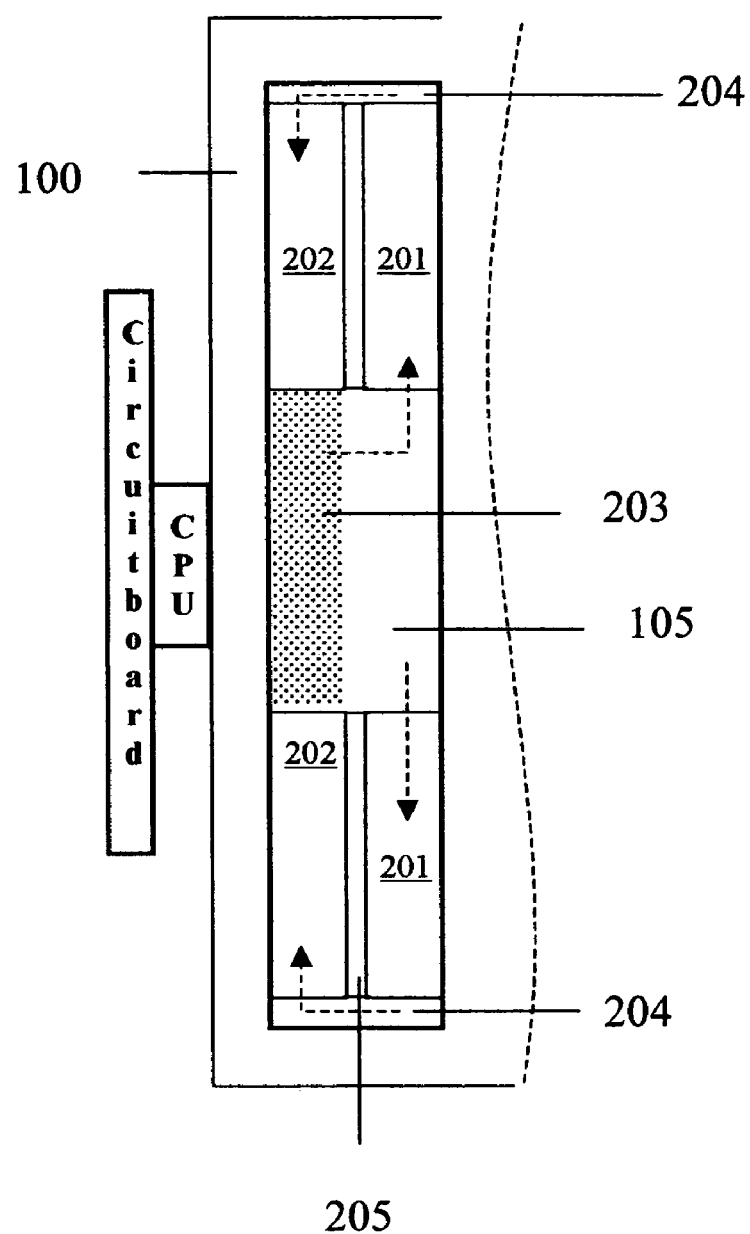
FIG. 12 Vertical use of the invention.

FIG. 12 shows that the invention as shown in FIG. 3 can be used in a vertical direction. Part of the vapor from the wick 203 condenses directly on the inner wall opposite to the wick 203 or enters the first set of bottom parallel grooves 201 and condenses herein. The condensed liquid flows downward, driven by the vapor flow as well as the gravity, into the liquid pool at the bottom end (not shown). With the combined capillary action of the wick 203 and of the parallel grooves 202, the working liquid is pulled up back to the wick 203.

Part of the vapor from the wick 203 goes up to the first set of top parallel grooves 201 and condensed herein. Some of the condensed liquid may drop into the first set of bottom parallel grooves 201. Some of the condensed liquid is driven upward by the vapor flow to enter the top conveying slot 204 and then the second set of parallel grooves 202, before it finally flows back to the wick 203.

In order to enhance the capillary pulling force on the recycled liquid for those embodiments where two sets of parallel grooves are used, the hydraulic diameters (or the cross-sectional areas of the flow path) of the second set of parallel grooves 202 are made smaller than those of the first set of parallel grooves 201.

Figure 13:
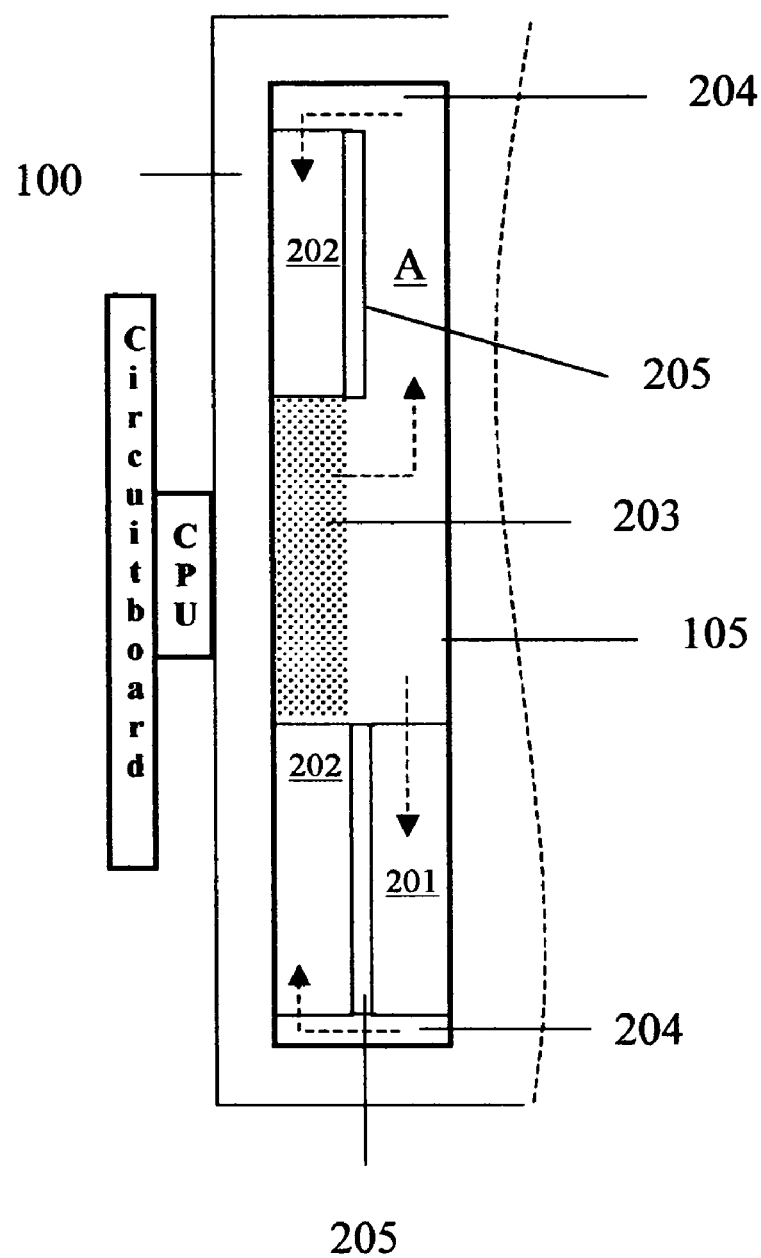
FIG. 13 Ninth embodiment of this invention.

FIG. 13 shows a ninth embodiment of this invention. This embodiment is a modified version of FIG. 12. The first set of top parallel grooves 201 in FIG. 12 is replaced with a space A. As the vapor from the wick 203 enters space A, part of it condenses on the inner wall of the metal base 100. The condensed liquid either drops to the first set of bottom parallel grooves 201 or is driven upward by the vapor flow across the conveying slot 204 into the second set of top parallel grooves 202. The second set of parallel grooves 202 functions as a passage for the condensed liquid to flow back to the wick 203 by the capillary force provided by the micro grooves 202 and the wick 203.

Figure 14:
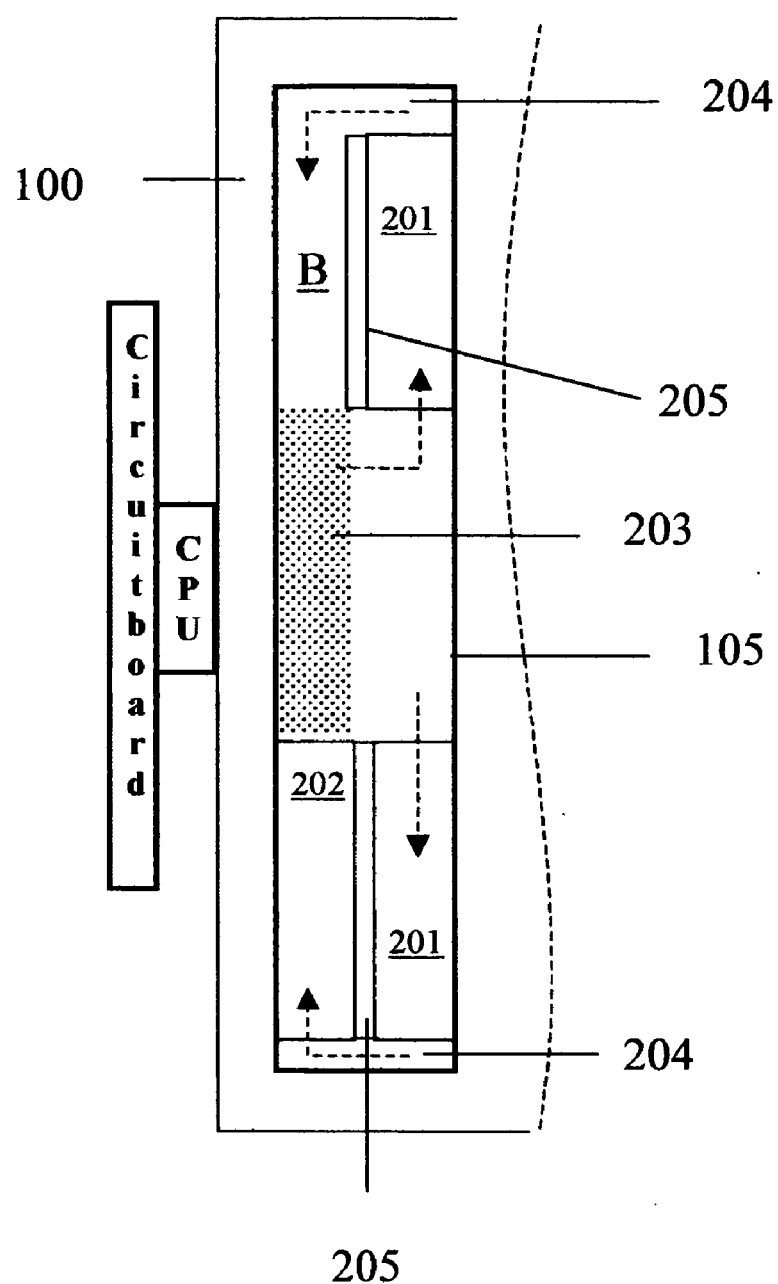
FIG. 14 Tenth embodiment of this invention.

FIG. 14 shows a tenth embodiment of this invention. This embodiment is a modified version of FIG. 12. The second set of top parallel grooves 202 in FIG. 12 is replaced with a space B. The space B functions as a passage for the condensed liquid to flow back to the wick 203 by gravity and the capillary force provided by the thin space B and the wick 203.

Figure 15:
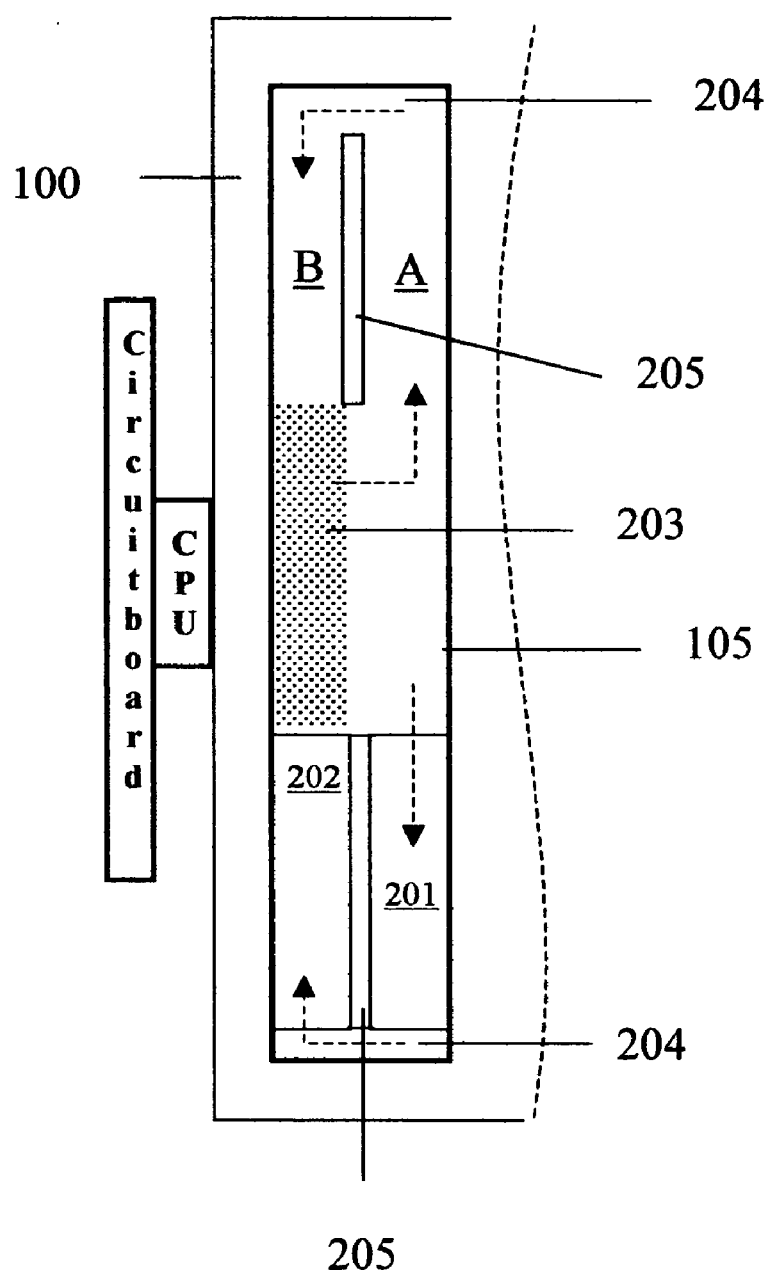
FIG. 15 Eleventh embodiment of this invention.

FIG. 15 shows an eleventh embodiment of this invention. This embodiment is a modified version of FIG. 12. The first set of top parallel grooves 201 in FIG. 12 is replaced with a space A; while the second set of top parallel grooves 202 is replaced with a space B. The space B functions as a passage for the condensed liquid to flow back to the wick 203 by gravity and the capillary force provided by the thin space B and the wick 203.

Figure 16:
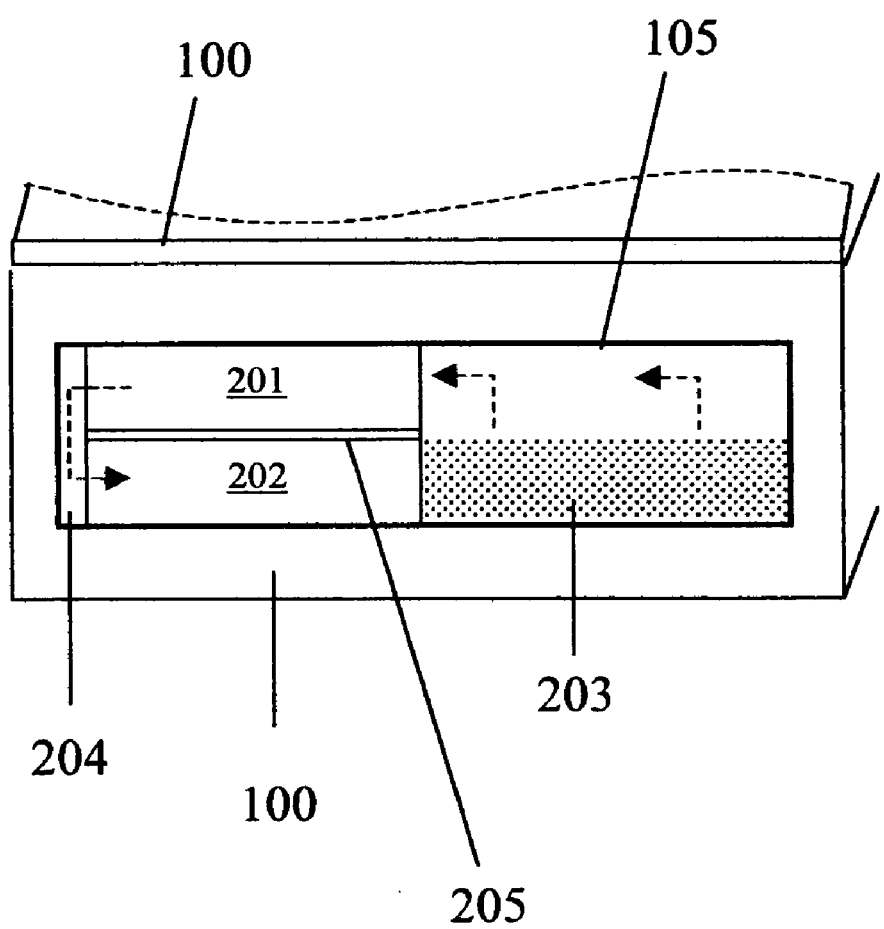
FIG. 16 Twelfth embodiment of this invention.

FIG. 16 shows a twelfth embodiment of this invention. This embodiment is a simplified version of FIG. 3 or FIG. 4. A single first set of parallel grooves 201 and a single second set of parallel grooves 202 are used. The recycle mechanism is exactly the same as described in FIG. 3 or FIG. 4.

Figure 17:
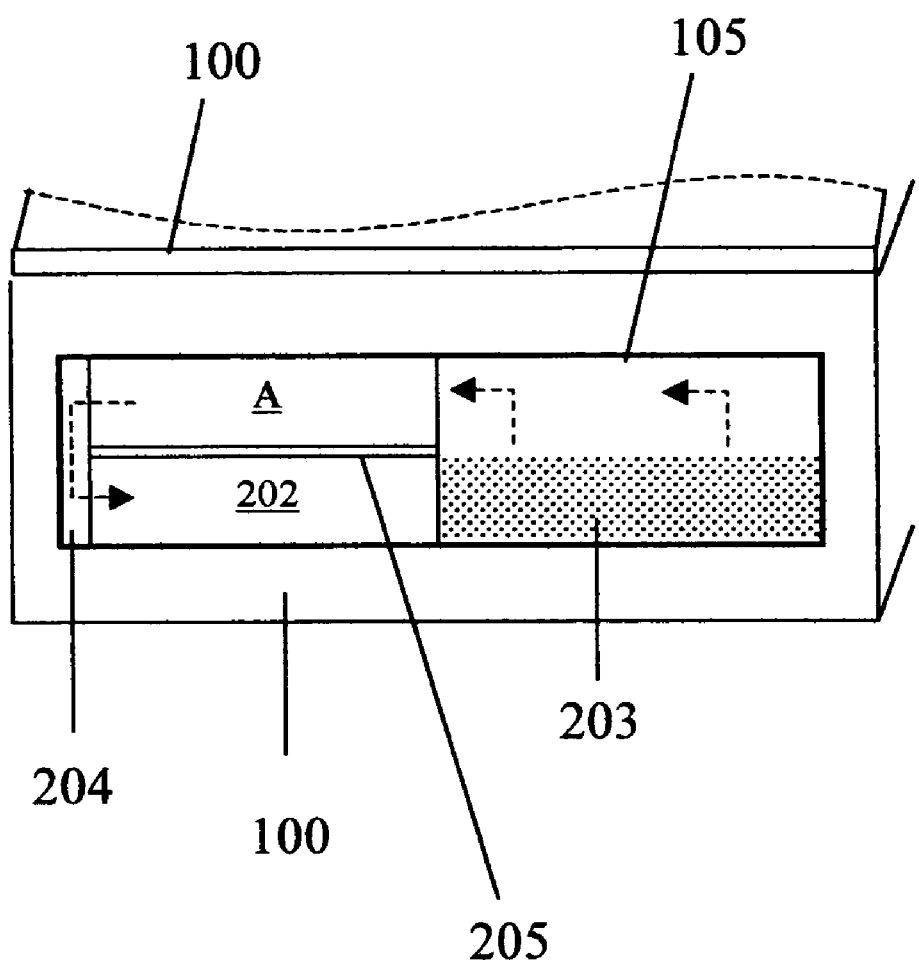
FIG. 17 Thirteenth embodiment of this invention.

FIG. 17 shows a thirteenth embodiment of this invention. This embodiment is a modified version of FIG. 16. The first set of parallel grooves 201 in FIG. 16 is replaced with a space A. As the vapor form the wick 203 enters space A, part of it condenses on the inner wall of the metal base 100. The condensed liquid is driven by the vapor flow across the conveying slot 204 into the second set of parallel grooves 202. The liquid in the grooves 202 then flows back to the wick 203 by gravity and the capillary force provided by the micro grooves 202 and the wick 203.

Figure 18:
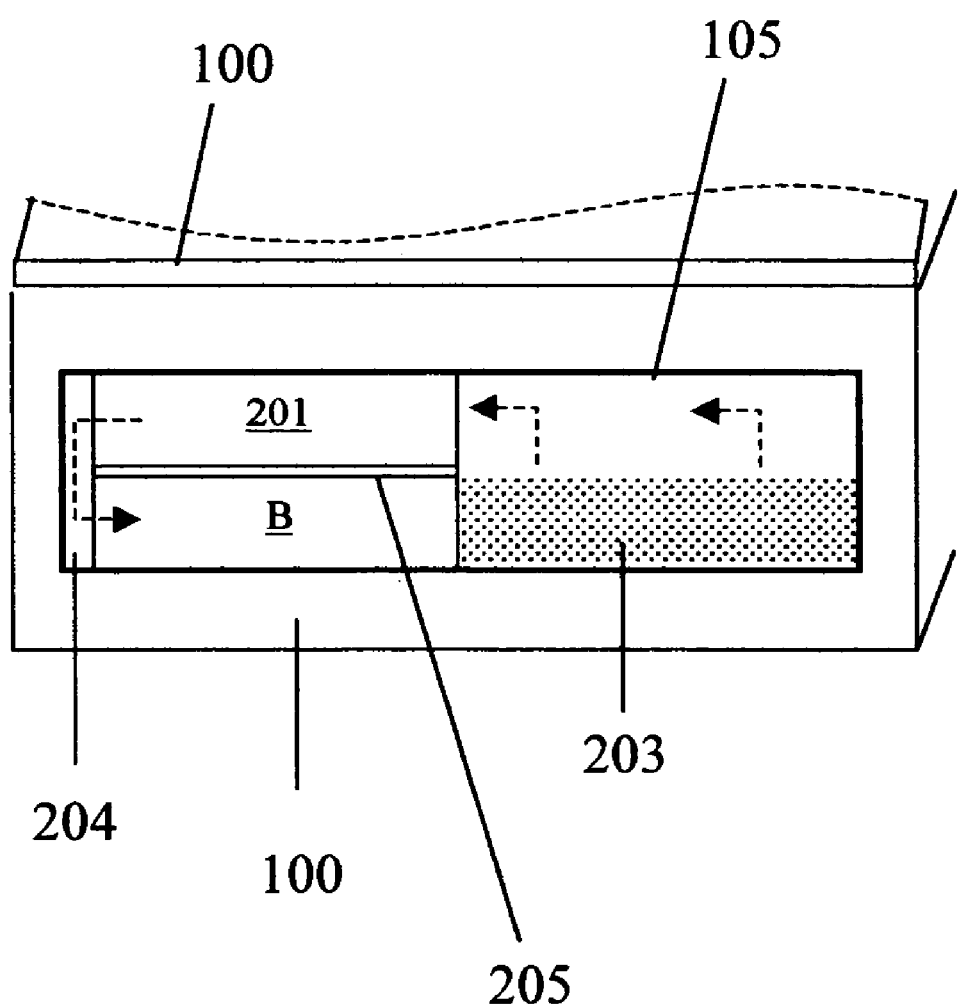
FIG. 18 Fourteenth embodiment of this invention.

FIG. 18 shows a fourteenth embodiment of this invention. This embodiment is a modified version of FIG. 16. The second set of parallel grooves 202 in FIG. 16 is replaced with a space B. The space B functions as a passage for the condensed liquid to flow back to the wick 203 by the capillary force provided by the thin space B and the wick 203.

Figure 19:
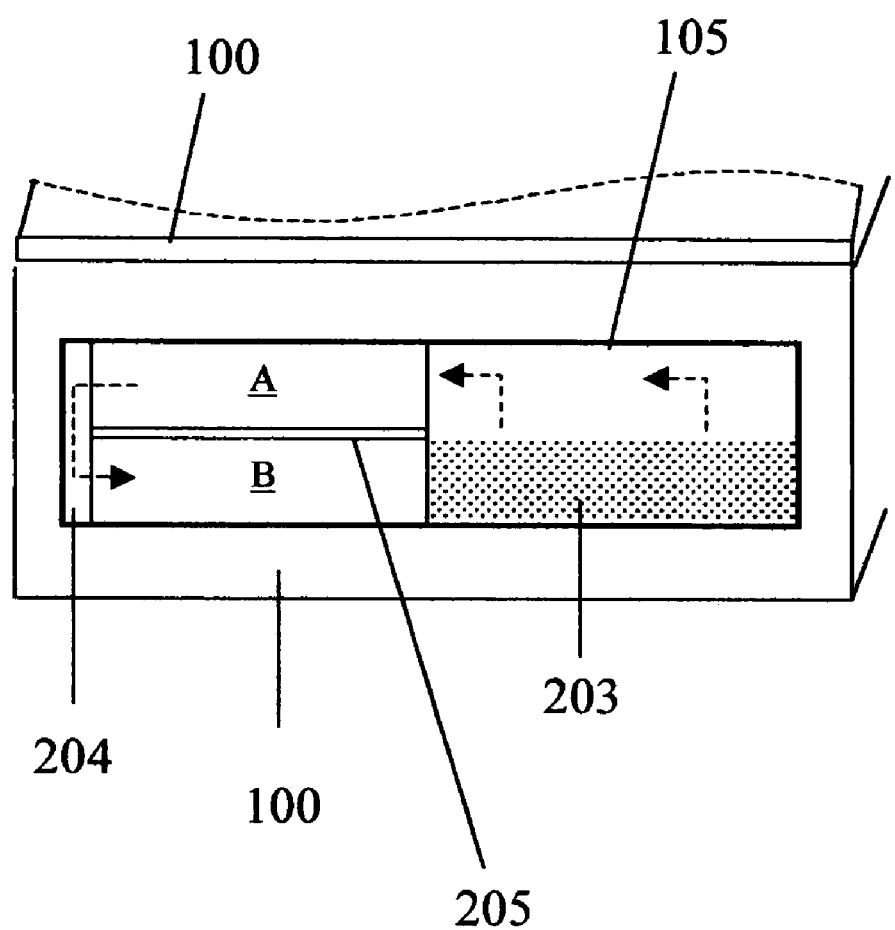
FIG. 19 Fifteenth embodiment of this invention.

FIG. 19 shows a fifteenth embodiment of this invention. This embodiment is a modified version of FIG. 16. The first set of parallel grooves 201 in FIG. 16 is replaced with a space A; while the second set of parallel grooves 202 is replaced with a space B. As the vapor form the wick 203 enters space A, part of it condenses on the inner wall of the metal base 100. The condensed liquid is driven by the vapor flow across the conveying slot 204 into the space B. The space B functions as a passage for the condensed liquid to flow back to the wick 203 by the capillary force provided by the thin space B and the wick 203.

Figure 20:
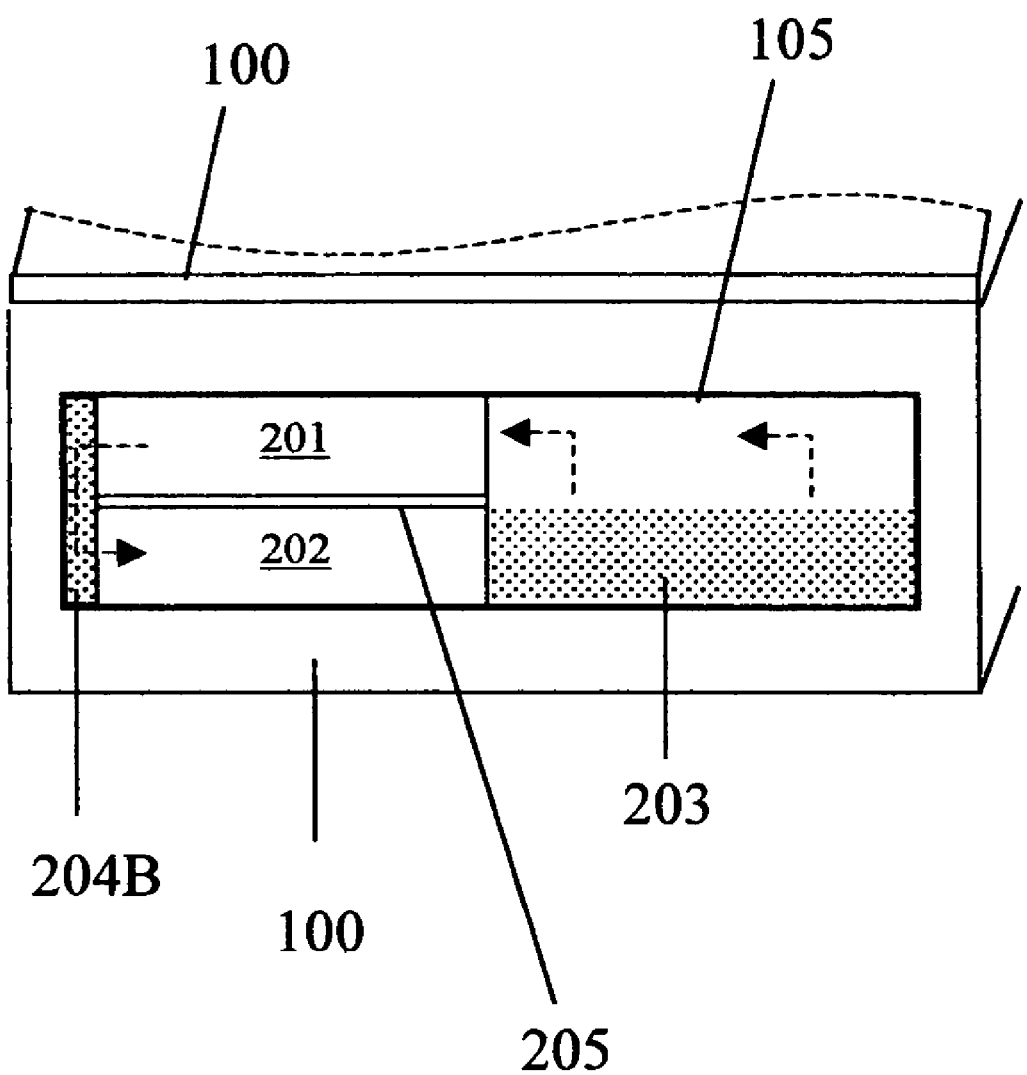
FIG. 20 Sixteenth embodiment of this invention.

FIG. 20 shows a sixteenth embodiment of this invention. This embodiment is a modification to all the previous embodiments. FIG. 20 shows a second wick 204B inserted into the slot 204 to smooth the liquid flow. The capillary action within 204B grabs the condensed liquid stronger than a slot 204 as shown in the previous embodiments. This design prevents the vapor from entering the second set of parallel grooves 202 and, therefore, leads to a smoother liquid flow.

Figure 21:
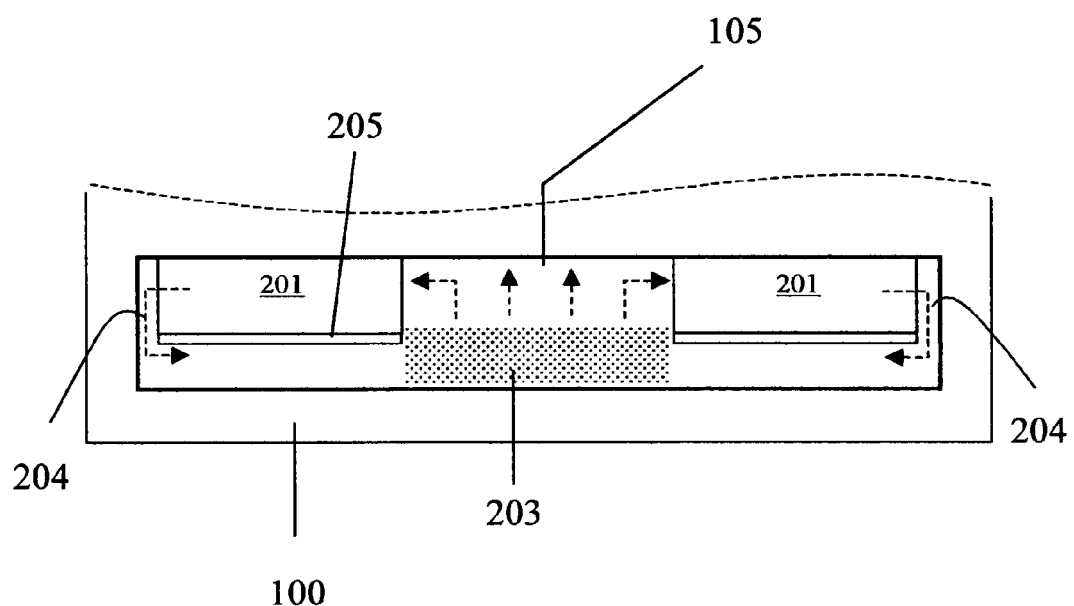
FIG. 21 Seventeenth embodiment of this invention.

FIG. 21 shows a seventeenth embodiment of this invention. This embodiment is a modification to FIG. 3 by replacing the grooves 202 in the lower section with a space B. The space B functions as a passage for the condensed liquid to flow back to the wick 203 by the capillary force provided by the thin space B and the wick 203.

Figure 22:
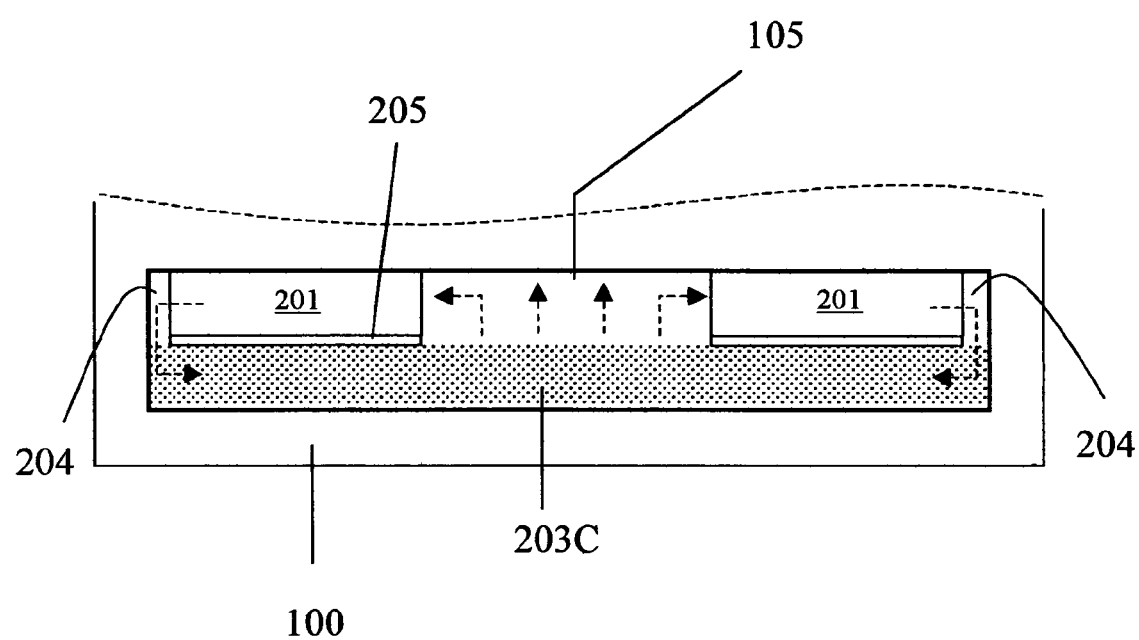
FIG. 22 Eighteenth embodiment of this invention
FIG. 23 Explosive perspective view of the embodiment FIG. 22.

FIG. 22 shows an eighteenth embodiment of this invention. This embodiment uses an elongated wick 203C as wide as that of the lower section. The middle part of the elongated wick 203C is used as an evaporator to absorb the heat from a heat-generating device attached below it (not shown). The other parts under the grooves 201 are used as a passage for the liquid to flow back to the middle part of the wick 203C The wick 203C can be sintered metal powder, metal wire mesh or metal wire cloth.

Figure 23:
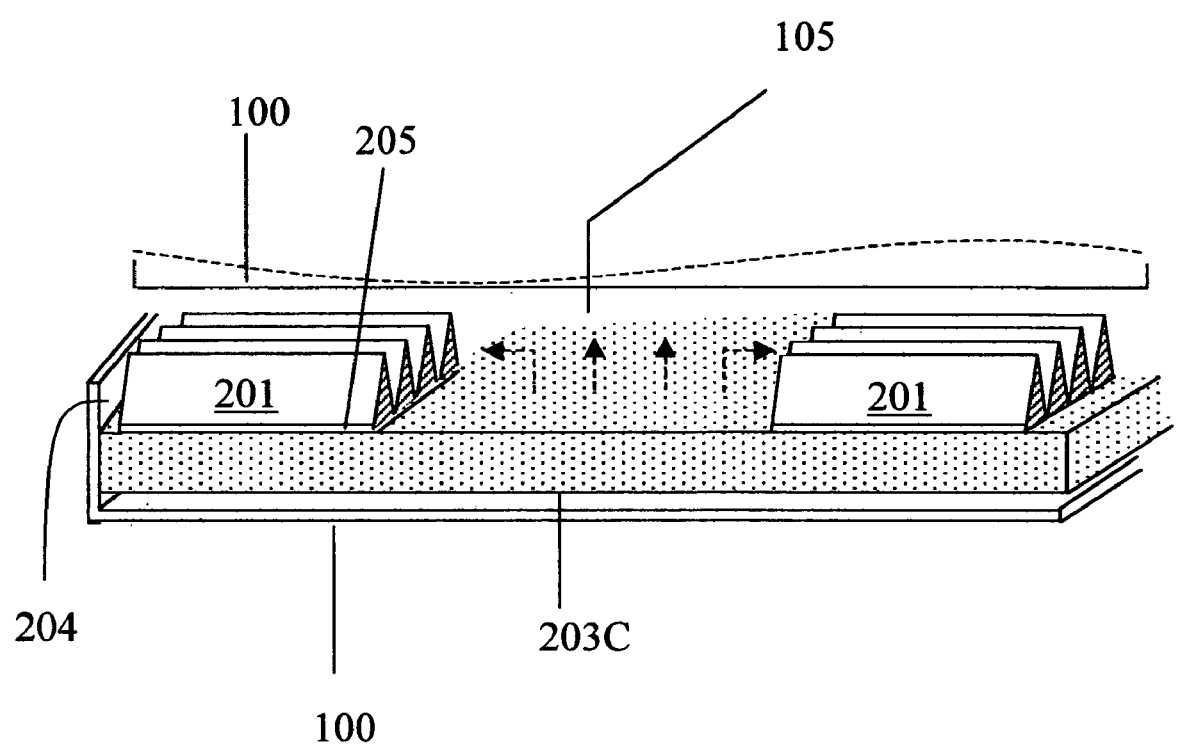

FIG. 23 is the explosive perspective view of the embodiment in FIG. 22. Two sets of parallel grooves 201 are placed in the two sides of the upper section of the cavity 105 to help collect the condensed liquid.

Figure 24:
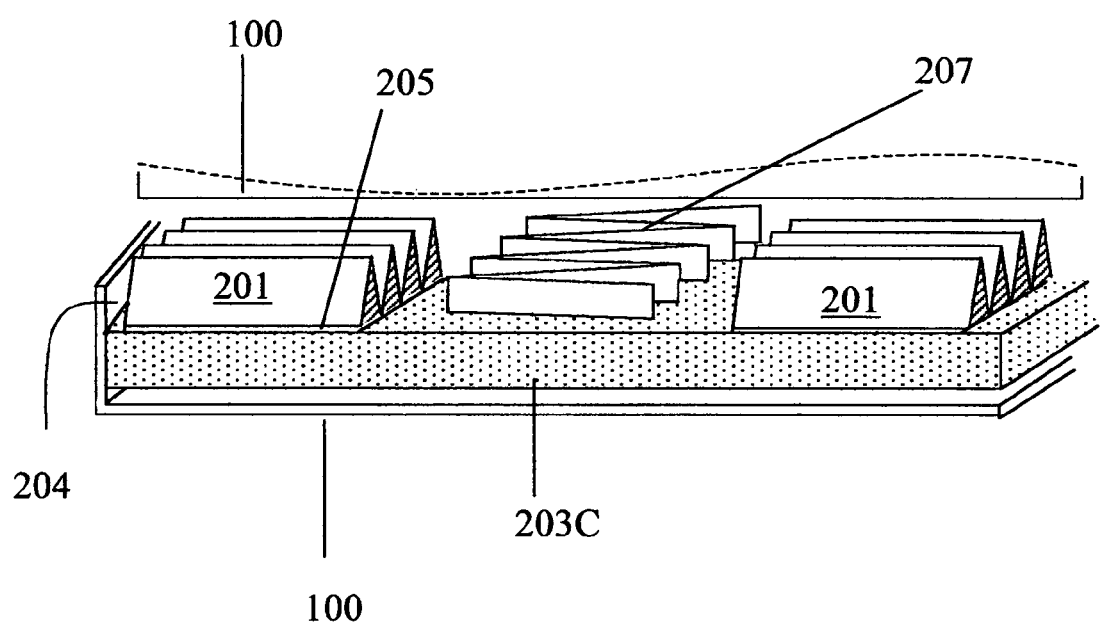
FIG. 24 Nineteenth embodiment of this invention.

FIG. 24 shows a nineteenth embodiment of this invention. A V-shaped corrugated metal 207 is placed on top of the wick 203C and between the two sets of parallel grooves 201.

Figure 25:
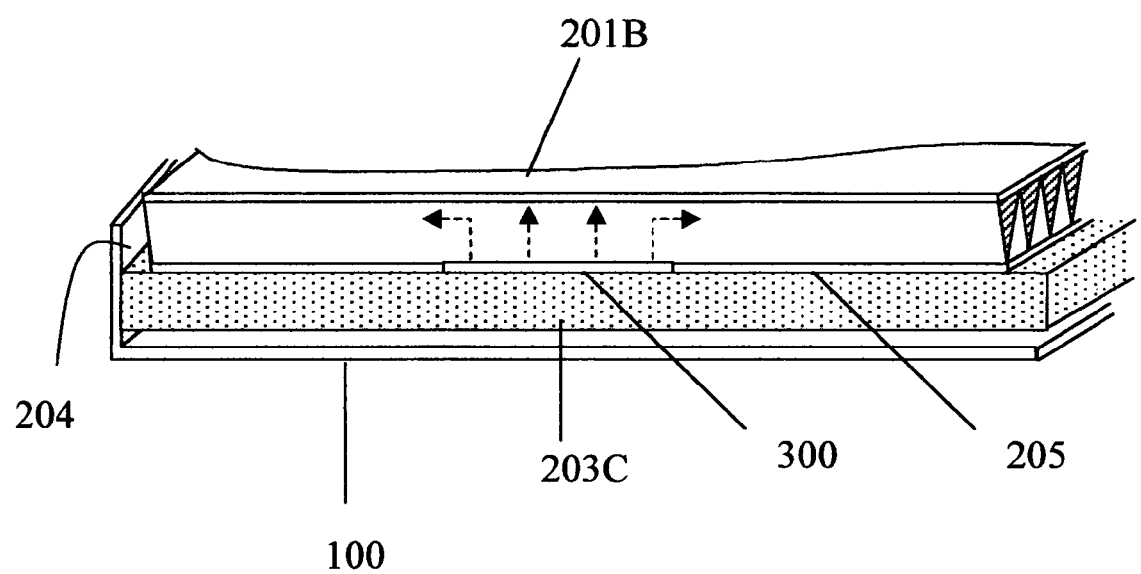
FIG. 25 Twentieth embodiment of this invention.

FIG. 25 shows a twentieth embodiment of this invention. This embodiment uses a set of elongated grooves 201B over the top of the long wick 203C. An isolation plate 205 made of a metal or nonmetal sheet is placed in between the elongated grooves 201B and the long wick 203C except for a space 300 arranged for the vapor to enter the grooves 201B. In this embodiment, the isolation plate 205 can alternatively be made of wire mesh or wire cloth so that a part of the condensed liquid collected in the grooves 201C can enter the wick 203C directly without flowing through the conveying slot 204

Figure 26:
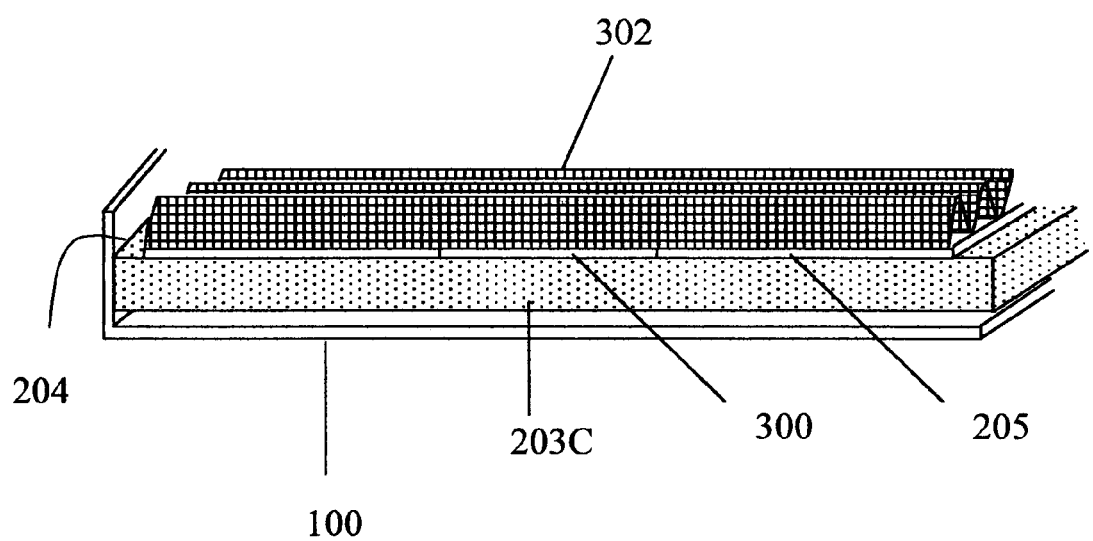
FIG. 26 Twenty-first embodiment of this invention.

FIG. 26 shows a twenty-first embodiment of this invention. This embodiment shows that a V-shaped corrugated wire mesh 302 is used to replace the elongated grooves 201B in the previous embodiment. The isolation plate 205 can alternatively be made pf wire mesh or wire cloth in this embodiment.

Figure 27:
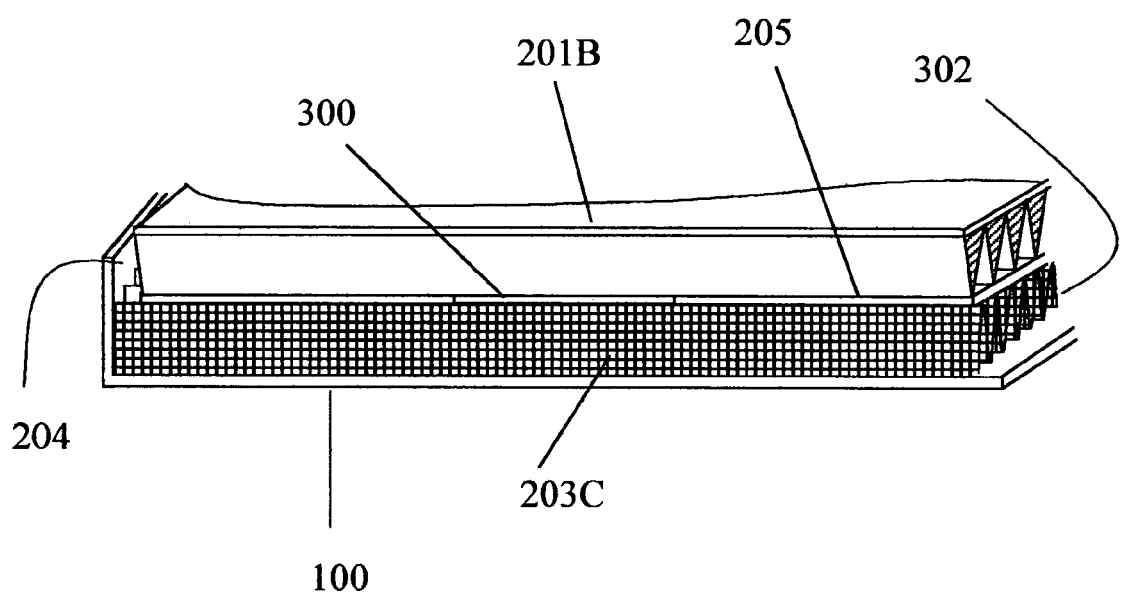
FIG. 27 Twenty-second embodiment of this invention.

FIG. 27 shows a twenty-second embodiment of this invention. This embodiment shows that the elongated wick 203C as in FIG. 25 can be replaced with a corrugated metal wire mesh 302.

Figure 28:
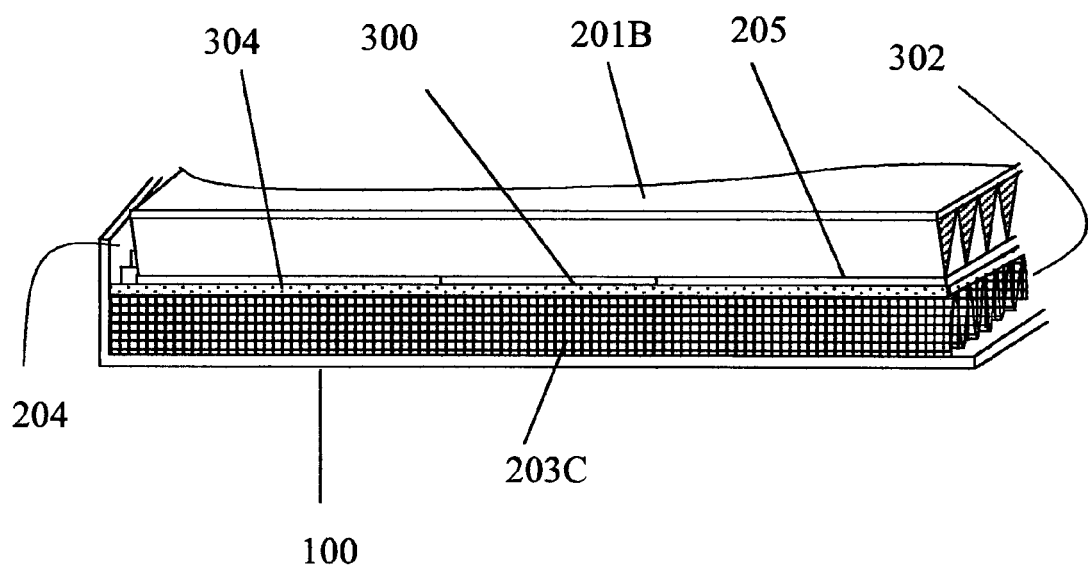
FIG. 28 Twenty-third embodiment of this invention.

FIG. 28 shows a twenty-third embodiment of this invention. This embodiment shows that a sheet of wire mesh 304 can be added above the corrugated metal mesh 302 to enhance capillary force, especially for the evaporator.

While the preferred embodiment of the invention have been described, it will be apparent to those skilled in the art that various modifications may be made without departing from the spirit of the present invention. Such modifications are all within the scope of this invention.

The invention claimed is:

1. A heat sink for a heat generating device, comprising:
an enclosed metal chamber, to be in contact with said heat generating device;
a two-phase vaporizable coolant recycled in said chamber to remove heat from said heat generating device;
a flow path comprising an upper section and a lower section, said upper section and said lower section being separated by an isolation plate and connected by a conveying conduit at ends for said coolant to flow from said upper section to said lower section, said upper section being in contact with the inner top wall of said chamber for vapor condensation and heat dissipation; said lower section functioning as part of a recycling passage for the condensed coolant;
a conveying conduit at one end of the upper section; a wick in said lower section, a portion of said wick functioning as an evaporator and the other portion of the said wick functioning as a liquid passage to draw said condensed coolant from said upper section by capillary attraction force through said conveying conduit; and said coolant collected within said evaporator waiting to be vaporized by the heat from said heat generating device; and
a guiding plate mounted on top of said evaporator to allow part of coolant condensed on the inner top surface of said chamber to flow downward back to the evaporator.

2. A heat sink for a heat generating device, comprising:
an enclosed metal chamber, to be in contact with said heat generating device;
a two-phase vaporizable coolant recycled in said chamber to remove heat from said heat generating device;
a flow path comprising an upper section and a lower section, said upper section and said lower section being separated by an isolation plate and connected by a conveying conduit at ends for said coolant to flow from said upper section to said lower section, said upper section being in contact with the inner top wall of said chamber for vapor condensation and heat dissipation; said lower section functioning as part of a recycling passage for the condensed coolant;

a conveying conduit at one end of the upper section; and a wick in said lower section, a portion of said wick functioning as an evaporator and the other portion of the said wick functioning as a liquid passage to draw said condensed coolant from said upper section by capillary attraction force through said conveying conduit; and said coolant collected within said evaporator waiting to be vaporized by the heat from said heat generating device, wherein said upper section and said conveying conduit are integrated with the top of said chamber as a unitary cover.

3. The heat sink as described in claim 1 or 2, wherein said wick is selected from the group consisting of sintered copper powder, sintered nickel power and sintered stainless-steel powder.

4. The heat sink as described in claim 1 or 2, wherein said wick is selected from the group consisting of metal mesh and metal cloth.

5. The heat sink as described in claim 1 or 2, wherein said upper section is selected from the group consisting of space and parallel grooves.

6. The heat sink as described in claim 5, wherein said grooves have a cross-section selected from the group consisting of: V-shaped, triangular and trapezoidal.

7. The heat sink as described in claim 1 or 2, further comprising a second capillary element placed in said conveying conduit.

8. The heat sink as described in claim 1 or 2, wherein a layer of corrugated metal selected from the group consisting of wire mesh and wire cloth forming parallel grooves is placed in the upper section.

9. The heat sink as described in claim 1 or 2, wherein said isolation plate is made from a group consisting of wire mesh and wire cloth.

* * * * *